United States Patent [19]

Ellrich et al.

[11] Patent Number: 4,916,805
[45] Date of Patent: Apr. 17, 1990

[54] METHOD FOR THE ATTACHMENT OF COMPONENTS TO A CIRCUIT BOARD USING PHOTOACTUATABLE ADHESIVE

[75] Inventors: Klaus Ellrich, Wörthsee; Oswald Gasser, Seefeld; Rainer Guggenberger, Hechendorf; Erich Wanek, Seefeld, all of Fed. Rep. of Germany

[73] Assignee: Espe Stiftung & Co. Produktions- und Vertriebs KG, Fed. Rep. of Germany

[21] Appl. No.: 317,671

[22] Filed: Mar. 1, 1989

[30] Foreign Application Priority Data

Mar. 2, 1988 [DE] Fed. Rep. of Germany ....... 3806738

[51] Int. Cl.[4] .............................................. H05K 3/30
[52] U.S. Cl. ......................................... 29/832; 29/840; 29/841; 156/272.2; 156/273.3; 156/275.5; 228/175
[58] Field of Search ................... 29/840, 841, 831, 832; 156/272.2, 275.5, 273.3; 228/175

[56] References Cited

U.S. PATENT DOCUMENTS

| 4,208,005 | 6/1980 | Nate et al. | 156/275.5 |
|---|---|---|---|
| 4,312,692 | 1/1982 | Ikeda et al. | 29/832 |
| 4,314,870 | 2/1982 | Ishida et al. | 156/272.2 |
| 4,358,331 | 11/1982 | Schmidt | 156/275.7 |
| 4,398,660 | 8/1983 | Pampelone et al. | 228/175 |
| 4,427,478 | 1/1984 | Corant et al. | 156/275.5 |
| 4,605,465 | 8/1986 | Morgan | 156/275.5 |
| 4,778,556 | 10/1988 | Wavy et al. | 156/272.2 |

FOREIGN PATENT DOCUMENTS 8400464 2/1984 World Int. Prop. O. ............ 29/832

OTHER PUBLICATIONS

Anonymous, "Use of Adhesives with Chemical Activators for Attaching Devices to Printed Circuit Boards", #28814, Apr. 1988.

Primary Examiner—Timothy V. Eley
Assistant Examiner—K. Jordan
Attorney, Agent, or Firm—Frost & Jacobs

[57] ABSTRACT

For the attachment of components using the SMT method a procedure is suggested in which the adhesive used is activated prior to fitting of the components to the circuit board by irradiation with light having a wavelength in the range of 200 to 600 nm to such an extent that the desired initial tackiness is maintained and there is no formation of skin on the surface of the adhesive. This makes it possible to cause the adhesive composition to fully cure in a shorter time and at lower temperature than has been possible so far without the wettability of the adhesive during the fitting of the components to the circuit board being impaired.

14 Claims, 1 Drawing Sheet

U.S. Patent    Apr. 17, 1990    4,916,805
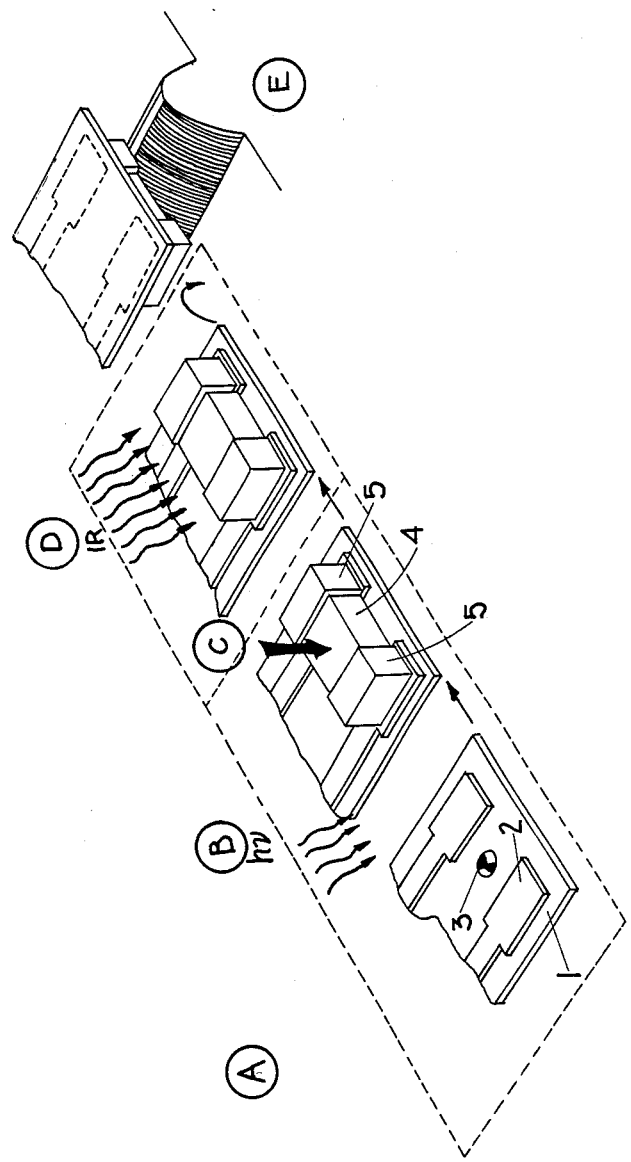

METHOD FOR THE ATTACHMENT OF COMPONENTS TO A CIRCUIT BOARD USING PHOTOACTUATABLE ADHESIVE

BACKGROUND OF THE INVENTION.

The invention relates to a method for the attachment of components to a circuit board comprising applying a photoactivatable adhesive to selected areas of the components or of the circuit board, fitting the components to the circuit board, curing the adhesive bonds at a temperature between 60° and 40° C. and producing soldered joints between the components and the circuit board.

Such a method has been proposed in the German Patent No.2,904,649, in which "surface mounted technology (SMT)" is used to attach electronic components such as capacitors, resistors and the like to circuit boards, as for instance printed circuit boards, hybrid ICs and the like using a photoactivatable adhesive, the bond serving primarily to hold the components on the circuit board firmly until the soldered joints between the components and the circuit board have been produced.

In this known method UV curable resins are used as adhesives, which contain a proportion of polymerizable monomers, photo-sensitizers, initiators and possibly a series of fillers.

Such UV curable acrylate resins rapidly cure at the parts which are accessible to light, but however for the curing at sites in the shadow, that is to say more especially where they are covered by the components, they require a second curing mechanism, which is effected by initiators for thermal polymerization and requires high temperatures. However, the greater the thermal load on the electronic components, the shorter their statistical expectancy of life.

Attempts have already been made to reduce the thermal loading during thermo-setting of the adhesive composition by using two adhesive points for each component with half under and half directly adjacent to the component in order in this manner to increase the degree of cure in the first UV induced cure stage. Integrated circuits (chips) with pins arranged around the housing do not however have any free space available for such half drops of adhesive.

The UV curable adhesives used in known methods are furthermore sensitive to atmospheric oxygen. Furthermore the pronounced coloring of the drop of adhesive often required for chip adhesives may reduce the depth of penetration of the UV radiation, and thus prevent a complete cure and later lead to signs of corrosion.

The European Patent publication (EP-A) No.0 182 744 describes photocurable epoxy resin compositions containing fillers, which have at least one photoinitiator of the metallocen type and which inter alia may be used for the bonding of active and passive components in microelectronic systems on circuit boards providing that the compositions contain electrically conducting fillers. The UV induced photocure is then if needed followed by a subsequent thermal cure.

The post published European Patent publication (EP-A) No.0 279 199 describes a method and apparatus for processing UV curable reactive resin compositions, in which the UV curable reactive resin composition is irradiated in the application device and is supplied directly to a substrate or a casting mold. There is no account of a method for the attachment of components to a circuit board however in this publication. Similarly the Japanese Patent publication (JP-A) No.6198740 describes the production of molding and coating compositions using a UV preactivated resin matrix. However, there is again no mention of any attachment of components to a circuit board.

DESCRIPTION OF THE INVENTION.

One object of the instant invention is to devise a method for the attachment of components and more especially of SMDs (surface mounted devices) on a circuit board which makes it possible to cause the cure of the adhesive composition employed in a shorter possible time and at temperatures lower than in the case of prior art methods without however reducing the wettability of the adhesive during the fitting of the components to the circuit board.

In the context of a method of the initially described type this object is achieved in the invention since the adhesive is activated by irradiation with light having a wavelength in a range of 200 to 600 nm prior to fitting to the circuit board to such an extent that the desired initial tackiness is maintained and there is no skin formation on the surface of the adhesive.

The initial tackiness of the activated adhesive makes it possible to convey the circuit board after fitting of the components thereto to the site where the thermal curing of the adhesive bond takes place. On the basis of a few simple preliminary tests a man skilled in the art will readily be able to see how great the initial tackiness, which in each case depends on the type and material of the components and the circuit board, has to be. The initial tackiness must in every case be so great that the components are not dislodged during conveyance from the fitting station to the station in which the thermal cure of the adhesive takes place, that is to say so that they do not change their exactly predetermined positions.

The method in accordance with the invention does offer the advantage that photoactivatable single component compositions may be used for attachment of the components, which have a good storage life but after activation completely and rapidly polymerize at low temperatures. Owing to the long life of the activated species produced in the exposure stage, it is possible to activate the compositions used prior to the mounting of the components in place. The disadvantage in the prior art of an incompletely cured adhesive film in zones in shadows is thus not possible in the method of the invention. Both stages of the cure, that is to say both the UV induced activation as well as the thermal cure, take place in the method of the invention evenly throughout the entire adhesive layer which has been applied to, irrespectively of whether such layer, after fitting of the components, is covered over by a component or freely accessible and visible.

The method of the invention furthermore offers the following advantages:
low volatility and low viscosity as well as low potential of toxicity of the monomers which may be used,
no inhibition of the reaction by atmospheric oxygen and thus no smear layer,
first-class adhesion on different substrates,
excellent chemical and physical properties of the adhesive layer, rapid and trouble-free activation and then an extremely short cure time at low temperatures for a complete cure, high stability in the stored condition of the non-activated compositions, and a strength of the bond sufficient to hold the components firmly on the circuit board until the soldered joints are produced, while at the same time - unlike the case of conductive adhesive bonds - the strength is not so great that the components may not be removed without danger of damage, for example for a repair.

The method in accordance with the invention makes it possible to so set the activation step by adjusting the exposure time, the dosage of energy from the actinic lamps used and the wavelength range of the light used that on the one hand there is enough reactive species for the subsequent rapid cure while on the other hand there is as yet no polymerization on the surface with the formation of a skin, which would prevent adequate wetting of the components and thus would render the adhesive composition unsuitable.

The formation of a superficial polymer film (skin formation) occurs in the case of all known prior art compositions which have so far been utilized for the adhesive bonding of components on circuit boards and at least partly are cured under the influence of radiation. On the other hand in the case of the method of the invention exposure is no longer necessary after mounting a component so that the casting of a shadow by the component of the circuit boards is not able to have any disturbing effect. The activation of the adhesive used prior to fitting the components in place causes the subsequent thermal cure to be greatly accelerated so that it takes place very much more rapidly than in the case of prior art heat curable adhesives which are used for bonding components to circuit boards.

In the method of the invention the UV induced activation of the adhesive may be either caused after the application of the adhesive film to the circuit board or on the surface of the component to be bonded or even prior to the application of the adhesive, for example in the applying device, as for example a dispenser, by irradiation with light having a wavelength in the range of 200 to 600 nm. If the activation is to take place prior to the application, it is preferably undertaken within a time of between 1 second and 10 minutes, and preferably within a time of 1 minute, prior to the commencement of the application of the adhesive to the circuit board or to the component. In this respect it is preferred for the intensity and duration of the exposure to be so selected that the preactivated adhesive practically undergoes no change in viscosity (such as would substantially reduce the desired initial tackiness or would substantially cause an interfering skin formation on the surface of the adhesive) before application during a time of at least 1 minute to preferably at least 5 minutes and more preferred at least 20 minutes.

Advantageous embodiments of the invention are such that the activation of the adhesive is performed by irradiation with light having a wavelength of 300 to 500 nm during a time of 0.5 to 300 seconds, and the cure of the adhesive bond after fitting of components to the circuit board is effected during a time of up to 15 minutes. In accordance with a further preferred embodiment of the method of the invention the activation of the adhesive is carried out using daylight or daylight devices, preferably using a wavelength of 400 to 600 nm and more preferred between 400 and 500 nm. The adhesion produced in this manner of the bond is in any event so strong that it readily withstands the mechanical load during the subsequent soldering operation, more especially in a wave or drag solder bath, with an optimum low temperature load on the electronic components being present, at the same time.

Advantageous further developments of the method in accordance with the invention are furthermore such that a cationically curable adhesive composition which is able to flow before activation and has a viscosity of 0.05 to 1000 Pa.s is used as said photoactivatable adhesive. A fair compromise between processability and the wetting properties of the adhesive compositions used is achieved at a viscosity of such compositions, as measured prior to activation, of 0.to 500 Pa.s, with a range of 0.4 to 200 Pa.s having turned out to be particularly suitable.

As a photopolymerizable composition, which undergoes polymerization essentially in accordance with a cationic reaction mechanism, it is preferred in accordance with the invention to utilize a mixture consisting of:

(a) 10 to 99.95% by weight, and preferably 70 to 98% by weight, of at least one cationically curable resin and/or a cationically polymerizable monomer; (b) 0.05 to 10% by weight and more especially 2 to 6% by weight, of at least one photoinitiator, which forms Lewis or Bronsted acids under the action of light; (c) 0 to 89.95% by weight, and preferably 0 to 28% by weight, of one or more fillers, thixotropifying agents, adhesion promoters and/or other conventional additives.

In accordance with a preferred embodiment of the method in accordance with the invention it is also possible to use such photopolymerizable compositions (resins and/or monomers), which in addition to a cationic curing mechanism also have a radicalic one. Such adhesive compositions consist of:

(a) 10 to 89.9% by weight of at least one cationically curable resin and/or of a cationically polymerizable monomer;

(b) 0.05 to 10% by weight of at least one photoinitiator, which under tee action of light forms Lewis or Bronsted acids;

(c) 0 to 89.9% by weight of one or more fillers, thixotropifying agents, adhesion promoters and/or other conventional additives;

(d) 10 to 80% by weight of at least one resin and/or monomer polymerizing in accordance with a radicalic polymerization mechanism;

(e) 0.05 to 5% by weight of at least one photoinitiator, which under the action of light produces radicals; and (f) if needed, 0.05 to 5% by weight of at least one photosensitizer and/or activator.

In this respect the resins and/or monomers polymerizing in accordance with a radicalic polymerization mechanism preferably consist of the acrylic acid and/or methacrylic acid esters of mono- or polyvalent alcohols, the acrylic and/or methacrylic acid esters of polyvalent alcohols being particularly preferred.

The cationically curable resins or cationically polymerizable monomers suitable for use in the method of the invention may be for instance mono- or polyfunctional vinylethers and vinyl esters. Suitable vinylethers include trimethylolpropane-trivinylether, ethyleneglycol-divinylether and cyclic vinylethers. Triethyleneglycol-divinylether is particularly suitable.

Compounds which are generally satisfactory are the vinyl esters and vinylethers of polyfunctional alcohols, polyethylene- and polypropyleneglycols with vinylether terminal groups being preferred.

Further suitable compounds are cationically polymerizable heterocyclic compounds, as for instance epoxides, and in this respect preferred are the glycidylethers of mono- and polyvalent alcohols, as for instance diglycidylethers of bis-phenol-A. In order to achieve a high degree of reactivity the di- and polyepoxides of cycloaliphatic compounds are more especially suitable, as for instance the glycidylethers and β-methylglycidylethers of cycloaliphatic diols and polyols.

Furthermore, useable glycidyl compounds are the glycidyl esters of carboxylic acids, especially of di- and polycarboxylic acids, as for instance the glycidyl esters of succinic acid, adipic acid and phthalic acid, respectively.

Examples of particularly reactive glycidyl compounds are the diepoxides of vinylcyclohexane and of dicyclopentadiene and also 3-(3',4'-epoxycyclohexyl)-8,9-epoxy-2,4-dioxyspiro(5.5)-undecane and 3,4-epoxycyclohexylmethyl-3',4'-epoxycyclohexyl carboxylate.

Preferred epoxide resins are diglycidylethers, possibly in prelengthened and/or prepolymeric form, of divalent phenols or divalent aliphatic alcohols with two to four carbon atoms, the prelengthened diglycidylethers of 2,2-bis-(4-hydroxyphenyl)-propane being more particularly preferred.

Generally useful as photoinitiators, which under the action of light form Lewis or Bronsted acids, are those photoinitiators which are conventionally used for cationic polymerization, as for instance aryldiazonium salts, diaryliodonium salts, triarylsulfonium salts and metallocen-like complex salts.

A class of photoinitiators preferred for the purpose of the invention is constituted by the metallocen complex salts of the European Patent publication (EP-A) No. 0 182 744, more especially the compounds (Ia) and (Ib):

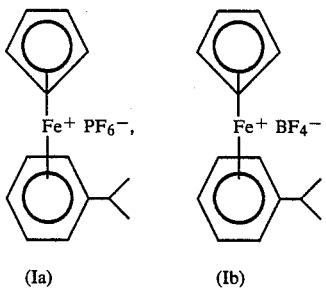

(Ia)    (Ib)

A further preferred class of photoinitiators for the cationic polymerization are the diaryliodonium salts of the formula:

Ar$_2$J$^+$X$^-$, wherein Ar denotes a substituted or unsubstituted arene, as for instance benzene, toluene, xylene, ethylbenzene, methoxybenzene, naphthalene, 1,2-dihydronaphthalene, phenanthrene, anthracene, 9,10-dihydroanthracene, diphenylene, biphenyl, cumene; and wherein X$^-$denotes a complex anion, as for instance BF$_4^{31}$, PF$_6^-$, AsF$_6^-$, SbF$_6^-$, and preferably BF$_4^-$ or PF$_6^-$.

Particularly preferred compounds are diphenyliodonium tetrafluoroborate, ditoluyliodonium tetrafluoroborate, ditoluyliodonium hexafluorophosphate and di-t-butylphenyliodonium tetrafluoroborate. Further suitable diaryliodonium salts are listed for instance in "UV Curing", Science and Technology, edited by S. Peter Pappas, Technology Marketing Corporation, Norwalk, USA 06851 (1980), incorporated herein by reference.

Preferably the diaryliodonium salts are used together with photoinitiators, which produce radicals under the action of light. Suitable photoinitiators of this kind are mono- and α-diketones, benzoins, benzoinethers, benzilketals and more especially acylphosphine compounds of the general formula II:

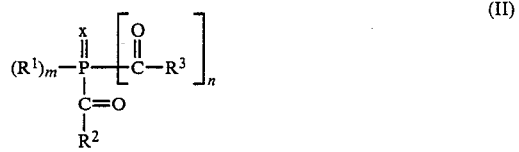

wherein m = 1, n = and x = O or m = 2, n = 0 and x = O or S,

R$^1$ denotes a straight chained or branched chain C$_{1-6}$ alkyl radical, a cyclohexyl, cyclopentyl, phenyl, naphthyl or biphenylyl radical, a cyclohexyl, cyclopentyl, phenyl, naphthyl or biphenylyl radical, which is substituted by F, Cl, Br, I, C$_1$-C$_4$-alkyl and/or C$_1$-C$_4$-alkoxy, an S or N containing 5- or 6-membered heterocyclic ring, R$^2$ and R$^3$, which are the same or different, denote a cyclohexyl, cyclopentyl, phenyl, naphthyl or biphenylyl radical, or a cyclopentyl, cyclohexyl, phenyl, naphthyl or biphenylyl radical, which is substituted by F, Cl, Br, I, C$_1$-C$_4$-alkyl and/or C$_1$-C$_4$-alkoxyl, or an S or N containing 5- or 6-membered heterocyclic ring or R$^2$ and R$^3$ together are joined to form a ring, which contains 4 to 10 carbon atoms and may be substituted with 1 to 6 C$_{1-4}$ alkyl radicals.

The fillers used in the adhesive compositions of the present invention may be aluminium oxide, silicon dioxide, calcium carbonate, titanium dioxide, barium sulfate, mica and the like in powder form, while the thixotropifying agent may be preferably pulverulent silicon dioxide having a specific surface of 50 to 450 m$^2$/g. The fillers used are preferably silanized. The silanizing agent may be in the form of conventional silane coupling agents, as for instance γ-methacryloyloxypropyl trimethoxysilane and glycidyloxypropyl trimethoxysilane.

Other conventional additives for the adhesive compositions utilized in the invention are for instance peroxides, sensitizers such a anthracene, pigments, dyes, antioxidants and the like.

DETAILED DESCRIPTION OF THE DRAWING

The Invention will now be described further with reference to the drawing and the working examples.

The drawing diagrammatically shows the course of one of a number of possible different embodiments of the method of the invention for the attachment of SMDs on a circuit board. Essentially, the method comprises the sequence of the following steps A through E:

A—Application of an adhesive film 3 on a circuit board 1 provided with contact terminals 2. The photopolymerizable adhesive composition 3 has one of the formulations as described above and polymerizes essentially in accordance with a cationic reaction mechanism. The application of the adhesive film 3 may be performed by screen printing, pin transfer or from a dispenser in a conventional manner on predetermined areas of the circuit board 1. Alternatively the adhesive composition 3 may also be applied to the lower side of the component 4 to be attached to the circuit board 1.

B—Activation of the adhesive film 3 by irradiation with actinic light in the UV or visible wavelength range between 200 and 600 nm, preferably between 400 and 500 nm to such a degree and for such a long time that the desired initial tackiness is produced, without however causing the formation of skin on the surface of the adhesive.

C—Mounting the component 4 with its electrodes 5 on the circuit board 1 on the activated adhesive film 3 and the contact terminals 2.

D—Curing the adhesive film 3 at a temperature between 60° and 140° C., as for instance in a convection cabinet, using infrared radiant heaters or by means of the actinic radiation source used in stage B if it also produces infrared radiation.

E—Producing electrical contact between the terminals (not shown) of the components 4 and the printed wiring 2 by soldering in a wave or drag soldering bath.

In the case of another embodiment of the method in accordance with the invention the order of the steps A and B is reversed, that is to say so that the activation of the adhesive composition by irradiation with actinic light is performed even prior to the application of the adhesive either to the circuit board 1 or to the lower side of the component 4.

EXAMPLE 1

A resin composition is prepared by even mixing of 100 parts by weight of 3,4-epoxycyclohexylmethyl-3',4'-epoxy-cyclohexyl carboxylate, 3 parts by weight of ( $\eta^5$-2,4-cyclopentadiene-1- yl)-[(1,2,3,4,5,6)-(1 -methylethyl)-benzene]-iron (1+) hexafluorophosphate (1−) (sold by Ciba-Geigy under the registered trademark of Irgacure 261), and 6 parts by weight of pulverulent hydrophobized silicon dioxide having a specific surface of 71m$^2$/g and a particle size of less than 100 nm (Silica R-202 of the Degussa Company).

This resin composition has a viscosity of 1.7 Pa.s (Haake viscometer Rotovisko RV 100, PKI 0.5/28, 10%D). The resin composition is then applied by a dispenser to a printed circuit board in the form of a stable drop of adhesive between the contact terminals. The adhesive drop has a diameter to height ratio of about 2 to 1.

The drop of adhesive is then activated by an irradiation device which emits actinic light in a wavelength range of 400 to 500 nm (Curelight 01of the Precon Company with an emission of approx. 100 mW/cm$^2$) for a time of 20 seconds. After this a transistor in its housing (SOT-23 housing form) is applied thereto and irradiated with an infrared lamp (IR drying adapter YTCO1L of the Sartorius Company, 250 W, temperature equal to 72° C.) for 1 minute.

The circuit board with the component so fitted is placed in a wave or drag soldering bath (Zevatron Company, type EFT-1). The circuit board is drawn-in at the maximum speed setting 10 into molten solder being placed in a container heated to 250° C, and kept submerged for 10 seconds in order to solder the electrode parts to be soldered of the SOT housing to the connecting terminals. During the soldering operation there is no detachment of the SOT housing from the printed circuit board and the result is a completely satisfactory soldered component. The submerging operation is repeated 5 times without there being any detachment of the SOT housing from the circuit board.

EXAMPLE 2

The resin composition of example 1 is additionally mixed with 2 parts by weight of silanized silicon dioxide (R-202 of the Degussa Company) and stirred to produce a homogeneous mixture.

The resin composition has a viscosity of 2.8 Pa.s (Haake viscometer Rotovisko RV 100, PKI 0.5/28, 10%D).

The resin composition is used to bond a cylindrical resistor (Melf) to the circuit board.

Directly after irradiation with an infrared lamp (conditions as in example 1) the sample is examined with a universal testing instrument (Zwick Company 1435). The strength of the bond between the cylindrical component and the circuit board is measured by shearing the component off the circuit board (speed of feed of punch 1 mm/min.) The shearing of the component off the board requires an average force of 46 N. Since the area of the drop of adhesive amounts to 4 mm$^2$, the average shear strength is 11.5 N/mm$^2$ (MPa).

COMPARATIVE EXAMPLE 1

A conventional heat-curing single component epoxide adhesive for the attachment of SMDs on circuit boards (RD 860002 M of the Heraeus Company) is applied by a dispenser to the same printed circuit board as in example 2. Thereafter a cylindrical SMD in the form of a resistor (Melf) is mounted thereon and subsequently the circuit board allowed to stand in a heating cabinet (convection heater 120° C., 3 minutes) for curing the adhesive layer according to the manufacturer's instructions. After this the fitted circuit board is tested on a universal testing instrument (of the Zwick Company, 1435). The cylindrical SMD is sheared off using a punch with feed speed of 1 mm/min.

The average force needed for this is 41N, from which it may be calculated from the area of the drop of adhesive of 5 mm$^2$ that the average shear strength is 8.2 N/mm$^2$ (MPa).

As compared with the method of the invention the prior art commercial material leads to poorer shear strengths despite drastic curing conditions (3 minutes at 120° C. as opposed to 1 minute at 72° C.).

EXAMPLE 3

A resin composition is prepared by even mixing with stirring of 80 parts by weight of 3,4-epoxycyclohexylmethyl -3',4'-epoxycyclohexyl carboxylate, 20 parts by weight of a cationically curable resin (UVR 6351of the Union Carbide Corporation), 3 parts by weight of Irgacure (registered trade mark) 261(of the Ciba-Geigy Company) and 3 parts by weight of hydrophobized silicon dioxide powder having an average particle size of less than 100 nm and a specific surface of 71m$^2$/g (Silica R-202 of the Degussa Company).

The viscosity amounts to 1.0 Pa.s (Haake viscometer Rotovisko RV 100, PKI 0.5/28, 10%D).

This resin composition is then applied to a printed circuit board using a dispenser. The drop of adhesive is irradiated with a source of UV (UVAHAND 200 of Dr. Höhnle GmbH with an emitted light spectrum of 315 to 600 nm) at a distance of 10 cm, this corresponding to a UVA irradiation intensity of 15 mW/cm$^2$. The irradiation time amounts to 30 seconds. After this a transistor in an SOT-23 housing is placed on the activated adhesive drop and the printed circuit board is irradiated with an infrared lamp (IR drying adapter YTCO1L of the Sartorious Company, 250 W) for a time of 2 minutes, a temperature of 80° C. being attained. Directly after the irradiation the resulting fitted circuit board is placed in a drag soldering bath (Type EFT-1 of the Zevatron Company, maximum speed setting 10) in a container heated to 250° C. filled with fused solder and kept immersed for 10 seconds. There is no detachment of the transistor in the SOT-23 housing from the circuit board and the component is soldered to meet all requirements.

EXAMPLE 4

A resin composition is prepared by even mixing of 100 parts by weight of a bisphenol-A-diepoxide (GY 259 of the Ciba-Geigy Company), 3 parts by weight of Irgacure (registered trademark) 261 (of the same company) and 2.5 parts by weight of cumene hydroperoxide.

The resin composition has a viscosity of 11 Pa.s (Haake viscometer Rotovisko RV 100, PKI 0.5/28, 10%D). This resin composition is used to produce the same sample as in example 1, with the single exception however that in place of the SOT housing a block electrolytic capacitor (15 D of the Philips Company) is bonded. Directly after irradiation with the infrared lamp (under the same conditions as in example 1) the sample is placed in a drag soldering bath (of the Zevatron Company, type EFT-1). The circuit board is immersed at speed 4 into a container heated to 250° C. and filled with fused solder and held immersed for 5 seconds. During the soldering process there was no detachment of the electrolytic housing from the printed circuit board. The soldered joint was fully satisfactory.

EXAMPLE 5

A resin composition was prepared by even mixing of 50 parts by weight of 3,4-epoxycyclohexylmethyl-3',4'-epoxycyclohexyl carboxylate, 50 parts by weight of triethyleneglycoldivinylether, 4 parts by weight of ethyleneglycol, 3 parts by weight of bis-(4-methylphenyl)-iodonium hexafluorophosphate, 1 part by weight of bis-(2,6-dichlorobenzoyl)-4-n-propylphenyl phosphineoxide and 3 parts by weight of pulverulent hydrophobized silicon dioxide with a specific surface of 71m$^2$/g and a particle size of less than 100 nm (Silica R-202 of the Degussa Company).

The resin composition has a viscosity of 0.05 Pa.s (Haake viscometer Rotovisko RV 100, PKI 0.5/28, 10%D). The composition is then applied with the aid of a dispenser to a printed circuit board in the form of a drop of adhesive between the contact terminals.

The drop of adhesive is then activated for 20 seconds with an irradiating device which emits actinic light in a range of 400 to 500 nm (Curelight 01of the Precon Company, approximately 100 mW/cm$^2$). After this the circuit board is fitted with an electrolytic capacitor (15 D of the Philips Company) by hand and irradiated with an infrared lamp (infrared drying adapter of the Sartorius Company, 250 W, temperature equal to 72° C.) for one minute.

After this the resulting circuit board with the fitted component is placed in a mass soldering bath (type EFT-1 of the Zevatron Company). The circuit board is drawn-in at the speed stage 4 into a container heated to 250° C. filled with molten solder and left immersed for 3 seconds. During soldering there is no detachment of the electrolytic capacitor housing from the printed circuit board. The soldered joint is satisfactory in every respect.

The board is immersed again immediately without any detachment of the electrolytic capacitor housing taking place from the printed circuit board.

COMPARATIVE EXAMPLE 2

A conventional single component epoxide adhesive (RD860002M of the Heraeus Company) for the attachment of SMDs on circuit boards is applied by means of a dispenser to the same printed circuit board as in example 5. After this a block-like SMD (electrolytic capacitor 15 D of the Philips Company) is mounted thereon and the circuit board then irradiated for a cure of the adhesive film with an infrared lamp (drying adapter of the Sartorius Company, 250 W, temperature equal to 72° C.) for three 3 minutes.

The resulting circuit board with the component fitted thereon is placed in a mass soldering bath (of the Zevatron Company, type EFT-1). The circuit board is moved at the speed stage 4 into a container heated to 250° C. and containing molten solder and kept immersed for 3 seconds. This causes the SMD to be detached from the printed circuit board. Even under these mild cure conditions (1 minute thermal cure at 72° C.) the conventional single component adhesive is not suited to the bonding of SMDs.

COMPARATIVE EXAMPLE 3

A conventional single component epoxide adhesive for the attachment of SMDs on circuit boards (Amicon D-124-F supplied by Emerson and Cuming Company) as described in the comparative example 2 is applied to a printed circuit board and cured under the same conditions and tested in the drag soldering bath.

During the soldering the SMD became detached from the printed circuit board. This conventional single component epoxide adhesive is thus not suitable as an adhesive for SMDs under such mild conditions.

EXAMPLE 6

A resin composition is prepared by the even mixing of 100 parts by weight of 3,4-epoxycyclohexylmethyl-3',4'epoxycyclohexyl carboxylate, 2.5 parts by weight of cumene hydroperoxide, 3 parts by weight of Irgacure (registered trademark) 261(as supplied by the Ciba-Geigy Company) and 3 parts by weight of hydrophobized silicon dioxide powder with a specific surface of 71m$^2$/g and a mean particle size of less than 100 nm (R-202, supplied by the Degussa Company) while stirring.

The resin composition has a viscosity of 0.95 Pa.s (Haake viscometer Rotovisko RV 100, PKI 5.5/28, 10%D).

Using pin transfer two adhesive drops were applied to an SMD (IC D7508G supplied by NEC).

The adhesive drops were then activated using an irradiating device emitting actinic light in a range of 400 to 500 nm (Curelight 01 of the Precon Company, approximately 100 mW/cm$^2$) for 15 seconds. After this a printed circuit board was fitted with this SMD and irradiated with an infrared lamp (IR drying adapter YTCO1L of the Sartorius Company, 250 W) for 2 minutes (at 72° C.).

Thereafter the resulting fitted circuit board is placed in a drag soldering bath (of the Zevatron Company, type EFT-1). The circuit board is moved at maximum speed, stage 10, into a container heated to 250° C. containing molten solder and held immersed for 3 seconds. During soldering there is no detachment of the SMD from the printed circuit board. The soldered joints are fully satisfactory.

The dipping operation is repeated 3 times without any detachment of the SMD from the printed circuit board taking place.

COMPARATIVE EXAMPLE 4

A conventional single component epoxide adhesive for the attachment of SMDs to circuit boards (Amicon D-124-F supplied by Emerson and Cuming) is applied as in example 6 to an SMD (D7508G supplied by NEC) by means of a pin and then irradiated for 5 minutes with the same infrared lamp as in example 6.

After this the resulting fitted circuit board is moved into the container with molten solder as in example 6 under the same conditions with the result that the SMD becomes detached from the circuit board.

This conventional single component epoxide adhesive when subjected to these mild cure conditions (5 minutes thermal cure at 72° C.) is not suitable for the bonding of SMDs.

We claim:

1. A method for the attachment of components to a circuit board comprising applying a photoactivatable adhesive to selected areas of the components or of the circuit board, activating said adhesive prior to or after application thereof by irradiation with light having a wavelength in a range of 200 to 600 nm to such an extent that a desired initial tackiness is maintained and no skin formation on the surface of the adhesive takes place, subsequently fitting the components to the circuit board thereby establishing contact between said components, adhesive and circuit board, curing said adhesive at a temperature between 60° and 140° C. and subsequently producing soldered joints between the components and the circuit board.

2. The method as claimed in claim 1 wherein the activation of the adhesive is performed by irradiation with light having a wavelength of 300 to 500 for a time for 0.5 to 300 sec.

3. The method as claimed in claim 2, wherein the activation of the adhesive is performed by irradiation with light having a wavelength of 400 to 500 nm.

4. The method of any one of claims 1 to 3, wherein said curing of the adhesive bond after said fitting the component to the circuit board is performed during an interval amounting to up to 15 minutes.

5. The method of claim 1, wherein a cationically curable adhesive composition being able to flow prior to activation and having a viscosity of 0.5 to 1000 Pa.s is used as said photoactivatable adhesive.

6. The method as claimed in claim 5, wherein an adhesive composition is used having a viscosity prior to activation of 0.4 to 200 Pa.s.

7. The method of claim 1, wherein an adhesive composition is used consisting of:

(a) 10 to 99.95% of at least one cationically curable resin and/or cationically polymerizable monomer;
(b) 0.05 to 10% by weight of at least one photoinitiator, which under the influence of light forms Lewis or Bronsted acids; and
(c) 0 to 89.95% by weight of at least one filler, thixotripifying agent, adhesion promoter and/or other conventional additive.

8. The method as claimed in claim 7, wherein an adhesive composition is used which consists of:

(a) 70 to 98% by weight of at least one cationically curable resin and/or cationically polymerizable monomer;
(b) 2 to 6% by weight of at least one photoinitiator, which under the influence of light forms Lewis or Bronsted acids; and
(c) 0 to 28% by weight of at least one filler, thixotripifying agent, adhesion promoter and/or conventional additive.

9. The method of claim 1, wherein an adhesive composition is used which consists of:

(a) 10 to 89.9% by weight of at least one cationically curable resin and/or cationically polymerizable monomer;
(b) 0.05 to 10% by weight of at least one photoinitiator, which under the action of light forms Lewis or Bronsted acids;
(c) 0 to 89,9% by weight of at least one filler, thixotropifying agent, adhesion promoter and/or other conventional additives;
(d) 0 to 80% by weight of at least one resin and/or monomer polymerizing in accordance with a radicalic polymerization mechanism;
(e) 0.05 to 5% by weight of at least one photoinitiator, which under the action of light produces radicals; and
(f) if needed 0.05 to 5% by weight of at least one photosensitizer and/or activator.

10. The method of any one of claims 7, 8 or 9, wherein the component (a) of the adhesive composition consists at least in part of the diglycidylethers of divalent phenols and/or of divalent aliphatic alcohols.

11. The method of claim 1, wherein the activation of the adhesive is performed by irradiation with light having a wavelength of 300 to 500 nm for a time of 0.5 to 300 sec. and wherein a cationically curable adhesive composition being able to flow prior to activation and having a viscosity of 0.05 to 1000 Pa.s is used as said photoactivatable adhesive.

12. The method of claim 5, wherein an adhesive composition is used consisting of:

(a) 10 to 99.95% of at least one cationically curable resin and/or cationically polymerizable monomer;
(b) 0.05 to 10% by weight of at least one photoinitiator, which under the influence of light forms Lewis or Bronsted acids;
(c) 0 to 89.95% by weight of at least one filler, thixotropifying agent, adhesion promoter and/or other conventional additive.

13. The method of claim 5, wherein an adhesive composition is used which consists of:

(a) 10 to 89.9% by weight of at least one cationically curable resin and/or cationically polymerizable monomer;
(b) 0.05 to 10% by weight of at least one photoinitiator, which under the action of light forms Lewis or Bronsted acids;

(c) 0 to 89.9% by weight of at least one filler, thixo-tripifying agent, adhesion promoter and/or other conventional additive;

(d) 10 to 80% by weight of at least one resin and/or monomer polymerizing in accordance with a radicalic polymerization mechanism;

(e) 0.05 to 5% by weight of at least one photoinitiator, which under the action of light produces radicals; and (f) if needed 0.05 to 5% by weight of at least one photosensitizer and/or activator.

14. The method of any one of claims 12 or 13, wherein the component (a) of the adhesive composition consists of at least in part of the diglycidylethers of divalent phenols and/or of divelent alphatic alcohols.

* * * * *